Jan. 21, 1969 B. D. JOYCE 3,423,255

SEMICONDUCTOR INTEGRATED CIRCUITS AND METHOD OF MAKING THE SAME

Filed March 31, 1965

WITNESSES:

John G. Chopp

Leon M. Garman

INVENTOR

Benjamin D. Joyce

BY Gordon K. Telfer

ATTORNEY 3,423,255

SEMICONDUCTOR INTEGRATED CIRCUITS AND METHOD OF MAKING THE SAME

Benjamin D. Joyce, Laurel, Md., assignor to Westinghouse Electric Corporation, Pittsburgh, Pa., a corporation of Pennsylvania Filed Mar. 31, 1965, Ser. No. 444,208
U.S. Cl. 148—175 5 Claims
Int. Cl. H01l 7/36, 7/24, 7/44

ABSTRACT OF THE DISCLOSURE

In fabricating semiconductor integrated circuits having a dielectric isolation medium, a method is disclosed wherein the starting material for the fabrication operation is of different conductivity type from that in which the ultimately desired functional elements of the integrated circuit are formed. The material for functional elements is deposited, as by epitaxial growth, on the starting material. A preferential etchant may be used to remove the material of the semiconductivity type of the starting material but does not, relatively, remove that of the device portions so that the position of the final device surface may be more readily controlled.

Figure 1:
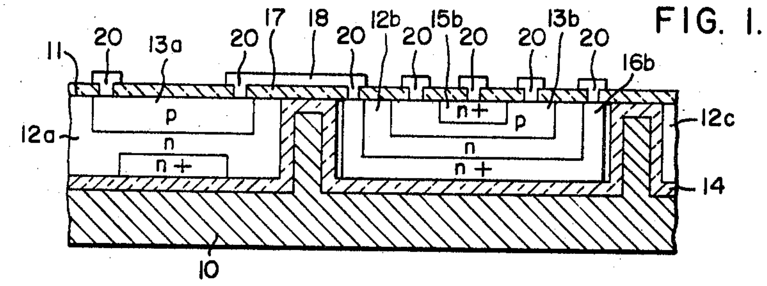

This invention relates to semiconductor devices and, more particularly, to semiconductor structures suitable for semiconductor integrated circuits and methods for making such structures.

In the art of integrated circuitry wherein the functions of a plurality of active and passive electronic components such as transistors, diodes, capacitors and resistors are provided within a unitary body of material, a principal problem has been that of providing adequate internal isolation between the various functional areas of the unitary body. Early approaches included the fabrication of the functional elements on a body of semiconductive material of sufficiently high resistivity to satisfy minimal isolation requirements. Another approach is the use of at least a pair of p-n junctions between the functional elements so that regardless of potential conditions, at least one junction is reverse biased and provides at least DC isolation. In order to improve AC isolation, proposals have been made for the use of an insulating material between the functional portions. It is convenient from the fabrication standpoint to use an oxide of the semiconductive material particularly where that material is silicon as layers of silicon dioxide may be fairly readily formed and can provide a high degree of electrical isolation. For further information on the background of the isolation problem and the use of a dielectric layer as a solution, reference should be made to copending application Ser. No. 410,666, filed Nov. 12, 1964, now abandoned, by B. T. Murphy et al. and assigned to the assignee of the present invention.

Prior proposals for the use of insulating material for isolation have had slow development to the commercial stage because of the criticality of some of the requisite fabrication operations. For example, in instances in which the starting material is the material from which the resulting functional elements are to be fabricated, it is necessary to perform a fairly critical etching operation after the deposition of the insulating material that provides isolation (commonly within grooves formed in the starting material). The purpose of this etch is to remove a portion of the starting material down to the isolated portions. Difficulty has been encountered in performing this etch successfully and reproducibly because of lack of a ready means of determining when the proper location of the etched surface has been reached.

It is, therefore, an object of the present invention to provide an improved structure suitable for reproducible fabrication of integrated circuits.

Another object of the present invention is to provide a method for the fabrication of integrated circuit structures having dielectric isolation which method requires less difficult etching operations than in prior proposals.

In accordance with the present invention, the above-mentioned and additional objects and advantages are achieved in a method that, briefly, departs from prior proposals in that the starting material for the fabrication operation is different than that in which the ultimately desired functional elements of the integrated circuit are formed. The material for those functional elements is deposited, such as by epitaxial growth, on the starting material so that when the required etch is performed down to the isolated device portions of material, a preferential etchant may be used that removes the material of the semiconductivity type of the starting material but does not, relatively, remove that of the device portions. Even if a preferential etch is not used, the difference in semiconductivity type of the starting material and the functional material permits easier control of the etching operation.

This fabrication process is completely compatible with existing fabrication techniques involving epitaxial growth and selective diffusion of impurities using oxide masks. Thus, it does not unduly complicate the fabrication process over that which is presently employed. It does, however, result in integrated circuit structures having improved isolation, in both AC and DC senses, so as to permit more successful fabrication of present types of integrated circuits and to make possible some not previously practical such as those requiring voltages between functional elements that would exceed the breakdown voltage of p-n junctions, if used for isolation, or those requiring high frequency operation where the p-n junction capacitance would undesirably limit performance.

The present invention, together with the above-mentioned and additional objects and advantages thereof, will be better understood by reference to the following description taken with the accompanying drawing, wherein:

FIGURE 1 is a partial sectional view of an integrated circuit formed in accordance with one example of the present invention, and FIGS. 2 through 7 are partial sectional views of semiconductor structures at various stages in the process of making an integrated circuit like that shown in FIG. 1.

Referring now to FIG. 1, there is shown a structure including a support member 10 on which are disposed a plurality of device portions 12*a*, 12*b* and 12*c* that are separated by a layer of dielectric material 14 to provide the desired electrical isolation.

The support member 10 is most conveniently a material that may be deposited from a vapor such as a semiconductor material formed by the reaction of a vaporized compound of the semiconductor material such as reactions performed in the epitaxial growth of semiconductor material. In the following description the support member will be described as being of polycrystalline semiconductor material as such is most likely to be the case with semiconductive material deposited on an oxide layer; however, it is to be understood that either by accident or intention the material of the support member may be monocrystalline and, of course, would still provide the support function that it provides in accordance with this invention.

The device portions 12*a*, 12*b* and 12*c* are of monocrystalline semiconductive material that is of device quality. In the particular embodiment of the invention described, these isolated portions will, in terms of their semiconductivity and resistivity, be selected in accordance with the characteristics desired for collector regions of transistors to be formed within the integrated circuit. For example, in the isolated portion **12*b* is shown a completed transistor structure including, in addition to the n-type collector region 12*b*, a p-type base region 13*b* and an n-type emitter region 15*b* successively disposed by conventional selective diffusion operations to form a structure having the so-called planar configuration. There is also shown within the collector region 12*b* a portion 16*b*** of more highly doped n-type material that underlies the base and emitter regions and extends to the upper surface of the device. This is primarily to provide a low transistor saturation resistance and to otherwise improve performance in the manner described and claimed in copending application Ser. No. 353,524, filed Mar. 20, 1964 by J. D. Husher et al. and assigned to the assignee of the present invention which should be referred to for further information on such structures and their method of fabrication.

In isolated portion **12*a* in FIG. 1 is disposed a single region 13*a* of p-type semiconductivity to provide a resistive region in the integrated circuit. In this example, the resistive region is connected to the collector region of the transistor by the conductive interconnection 18 that extends over a layer of insulating material 17 that lies on the surface of the device. Conductive contacts 20 are disposed at opposite ends of the resistive region 13*a*** and on the emitter, base and collector regions of the transistor structure and make ohmic contact with the semiconductive material. In the manner in which the regions within the isolated portions and the contacts and interconnections are formed the practice of the present invention is in accordance with the known technology of integrated circuits and is susceptible to the known variations so that such flexibility of integrated circuit design as presently exists is preserved.

It will be apparent to those skilled in the integrated circuit art that the transistor and resistor structures in FIG. 1 are merely exemplary and that other types of functional structures providing other types of transistor operation or that of diodes or capacitors may be formed within the isolated portions. Furthermore, some components may be disposed on the surface of the device such as where the insulating material 17 on the surface is employed as a dielectric in a capacitor or resistive elements are disposed on the surface. Many variations of the invention will suggest themselves to those skilled in the art as being suitable for practice with the isolation scheme disclosed herein.

The structure of FIG. 1 illustrates the complete electical isolation that is achieved between the functional elements of the integrated circuit by the insulating layer 14. The surface 11 of the structure should be suitably smooth and planar for the formation and use of diffusion masks and the thickness of the portions **12*a*, 12*b* and 12*c*** should be thick enough for diffusion of regions to form the functional elements yet thin enough so that saturation resistance in transistors is not undesirably high.

The structure of FIG. 1 will be better understood by a description of the method of making it which illustrates the principal features of the present invention.

Figure 2:
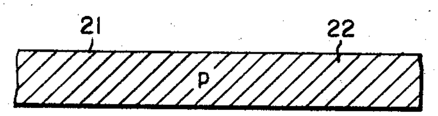

Referring to FIG. 2, there is shown a starting material 22 of a material on which device quality semiconductor material may be grown with subsequent preferential removal. In this example, the starting material is of p-type silicon although it will be understood that the semiconductivity type of the various regions may be reversed from that shown and other semiconductive materials may be employed. A thickness of several mils is desirable to provide mechanical strength in the starting material. The substrate or starting material 22 need meet no critical design criteria as to resistivity, 0.01 to ten ohm-centimeters being merely a range of suitable resistivity values. However, it is preferred that the resistivity of the starting material be relatively low, such as less than about 1 ohm-centimeter, to facilitate subsequent preferential etching.

Figure 3:
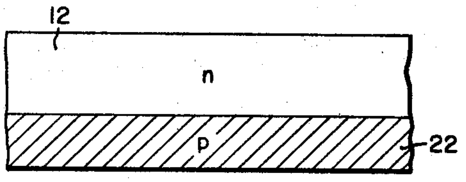

The starting material should have a surface 21 suitable for epitaxial growth thereon, such as one having near <111> orientation, which is prepared for epitaxial growth in accordance with conventional surface preparation techniques and, as shown in FIG. 3, has grown thereon a layer of *n* type semiconductivity material 12 from which the isolated device portions **12*a*, 12*b* and 12*c* (FIG. 1) are ultimately fabricated. In resistivity the layer 12 should be formed in accordance with the desired collector region resistivity at the p-n junction, typically within the range of about 0.1 to 10 ohm-centimeters. In thickness the layer 12 should be formed in accordance with the desired thickness of the ultimate device portions which may suitably be of about 10 to 20 microns. This thickness may be fairly readily controlled in accordance with known epitaxial growth techniques. Consequently, the thickness of the ultimate device portions 12*a*, 12*b* and 12*c*** is also easily controlled.

Figure 4:
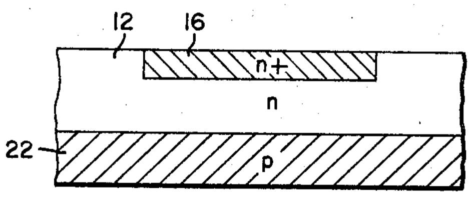

FIG. 4 shows the structure after there has been formed on the surface of the *n* type epitaxial layer a plurality of regions 16 of more highly doped *n* type material, here designated as $n+$, which may conveniently be formed by conventional selective diffusion techniques through an oxide mask and which will serve in the ultimate structure to provide part of the region **16*b* in the transistor structures. For this purpose it is, of course, not necessary that the region 16 be deposited in portions of the structure that are not intended for transistor fabrication. However, there is no disadvantage entailed by so doing. It will also be understood that the use of the region 16 may be omitted entirely if desired or that the epitaxial layer 12** may have a graded resistivity such as by the deposition of first a relatively high resistivity *n* type material on the surface of the starting material 22 followed by a layer of lower resistivity *n* type that would provide material equivalent to that provided by the diffused regions 16.

Figure 5:
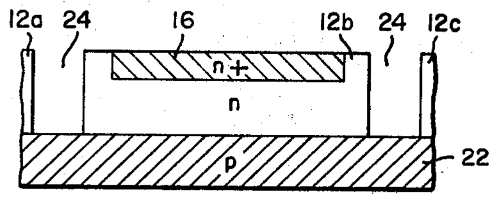

In FIG. 5 the material of the *n* type layer 12 has been separated by grooves 24 into a plurality of device portions **12*a*, 12*b* and 12*c*. This separation operation is most conveniently performed by the application to the surface of the material of a conventional photoresist which upon exposure and development provides a pattern of etch resistant material having openings only where the desired grooves are to be. This etch may be performed by using an etchant comprised of, for example, in parts by volume, 90 parts concentrated nitric acid and 10 parts concentrated hydrofluoric acid with the etching operation performed for a time sufficient to insure that the grooves 24 extend through the layer 12 and penetrate into the starting material 22**.

Figure 6:
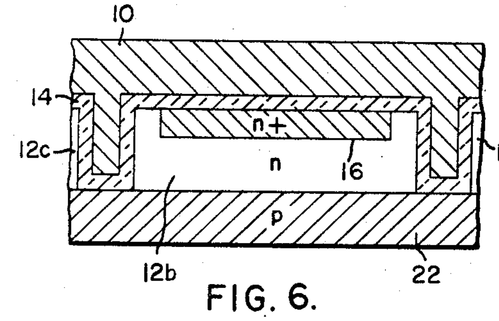

FIG. 6 shows the structure after two additional operations have been performed. First a layer 14 of pyrolytic silicon dioxide is formed such as by the reaction of silicon tetrachloride with carbon dioxide in a hydrogen ambient at a temperature between 1000 and 1200° C. The oxide thickness is controlled to between 5000 and 10,000 angstroms; if it is very thick then the difference in the thermal coefficient of expansion between the silicon and the silicon dioxide causes severe warpage.

On top of the oxide layer 14 there is disposed (FIG. 6) a body 10 of polycrystalline silicon formed conveniently in the same sort of epitaxial reactor as used for the formation of the *n* type layer 12 and the oxide layer 14. For mechanical stability, the thickness of body 10 should be about 6 to 8 mils. If desired, it may be doped to provide an equipotential ground plane for the integrated circuit.

Now is performed the removal of the p-type semiconductive starting material 22 so as to provide access to the surface of the device portions **12*a*, 12*b* and 12*c***. This may be performed by the use of a selective etchant that attacks p-type silicon more readily than n-type material so that the termination of etching can be controlled by an electrical conductivity type test that indicates when n-type material is reached. Preferential etches are known in the art. An example of one that attacks p-type silicon preferentially is an aqueous solution of potassium permanganate and hydrofluoric acid in accordance with the teachings of Landgren Patent 2,847,287, Aug. 12, 1958, which should be referred to for further details.

To some extent the point of termination can be controlled by the visual appearance on the surface of the oxide isolation areas 14; however, unless the grooves in which the oxide is deposited are formed to a precisely controlled depth, this test will not be adequate.

Figure 7:
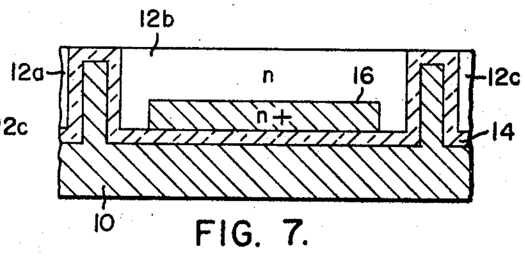

Following the removal of the p-type material 22, the structure illustrated in FIG. 7 is provided so that individual isolated device quality portions 12_a_, 12_b_ and 12_c_ exist and may be used for the formation of functional elements in accordance with any of the known techniques such as those described in connection with FIG. 1.

Because the oxide isolation 14 provides low capacitance between the functional elements, integrated circuits operable to higher frequency are now more practical than previously. Also, high voltages may exist between adjacent functional elements formed in device portions 12_a_, 12_b_ and 12_c_ without fear of breakdown because of the high dielectric strength of the oxide layer.

It will be understood that the use of silicon dioxide is not crucial to the practice of the present invention. Other insulating materials may be employed such as titanium dioxide (titania) deposited by vacuum sputtering and other materials and techniques will suggest themselves to those skilled in the art.

In prior technology in which device quality material is grown on a supporting substrate that contains diffused "floating collector" regions (low resistivity portions corresponding to regions 16), out diffusion from the floating collectors would modify the resistivity of the epitaxial material while such problem is not encountered in accordance with the present invention.

The process steps performed following the formation of the floating collector regions 16 including the separation of the layer 12 into device portions 12_a_, 12_b_ and 12_c_, the deposition of the pyrolytic oxide 14 and the polycrystalline semiconductive material 10 and the removal of the p-type starting material 22 all involve temperatures below about 1100° C. and hence will minimize out diffusion from the floating collector regions 16 into the epitaxial material 12.

Particularly advantageous is that the p-n junction formed during the epitaxial growth operation between starting material 22 and layer 22 provides means for better control of the etching operation and also provides means for controlling the thickness of the n type regions 12_a_, 12_b_ and 12_c_ in the resulting structure.

In view of the foregoing, it is believed apparent that by a relatively easy to practice modification of present integrated circuit fabrication techniques, there may be achieved a superior integrated circuit structure having improved isolation.

While the present invention has been shown and described in a few forms only, it will be apparent that various changes and modifications may be made without departing from the spirit and scope thereof.

What is claimed is:

1. In a method of forming a semiconductor integrated circuit structure of a plurality of functional device portions electrically isolated by a dielectric medium, the steps comprising: obtaining a unitary body of starting semiconductive material of p or n conductivity type on which epitaxial semiconductive material may be grown; forming a layer of epitaxial semiconductive material of opposite conductivity type on a planar surface of said body of starting material, said layer having a thickness and a resistivity suitable for functional device portions; separating said layer into a plurality of spaced portions attached to and protruding from said body of starting material, said body being kept unitary and supporting said portions; forming a layer of dielectric material over the exposed surfaces of said portions; forming a support member on said layer of dielectric material; and removing said body of starting material by use of an etchant that is preferential to material of the conductivity type of said body so a planar surface of each of said plurality of spaced portions of said layer is exposed.

2. The subject matter of claim 1 wherein: said layer is processed to form, prior to said removing of said body of starting material, at a surface thereof remote from said body, at least one region of said opposite conductivity type of more highly doped material than that of said layer immediately adjacent said body.

3. The subject matter of claim 1 wherein: said body of starting material is of p-type conductivity and said layer is of n-type conductivity.

4. The subject matter of claim 3 wherein: said etchant is an aqueous solution of potassium permanganate and hydrofluoric acid.

5. The subject matter of claim 1 wherein: following said removing of said body of starting material a plurality of electronic functional elements are formed within said exposed planar surfaces of said plurality of spaced portions of said layer.

References Cited

UNITED STATES PATENTS

| | | | |
|---|---|---|---|
| 3,332,137 | 7/1967 | Kenney | 29—423 |
| 3,332,143 | 7/1967 | Gentry | 29—583 |
| 3,158,788 | 11/1964 | Last | 317—101 |
| 3,200,311 | 8/1965 | Thomas | 317—234 |
| 3,290,753 | 12/1966 | Chang | 29—25.3 |
| 3,296,040 | 1/1967 | Wigton | 148—175 |
| 3,300,832 | 1/1967 | Cave | 29—25.3 |

WILLIAM I. BROOKS, *Primary Examiner.*

U.S. Cl. X.R.

29—578, 580; 148—187